United States Patent [19]

Mueller et al.

[11] Patent Number: 4,631,495
[45] Date of Patent: Dec. 23, 1986

[54] LOW-NOISE RF PREAMPLIFIER (ESPECIALLY FOR NUCLEAR MAGNETIC RESONANCE SYSTEM)

[75] Inventors: Otward M. Mueller, Ballston Lake; William A. Edelstein, Schenectady, both of N.Y.

[73] Assignee: General Electric Company, Schenectady, N.Y.

[21] Appl. No.: 730,522

[22] Filed: May 6, 1985

[51] Int. Cl.$^4$ .............................................. H03F 3/04
[52] U.S. Cl. ..................................... 330/310; 330/295
[58] Field of Search ................ 330/295, 310, 149, 278

[56] References Cited

U.S. PATENT DOCUMENTS 4,090,150  5/1978  Vachenauer ........................ 330/310
4,348,643  9/1982  Tennyson ............................ 330/310

OTHER PUBLICATIONS

Prasad, KBR et al., "Low Noise, Low Frequency Amplifier", Electro-Technology, vol. 15, No. 4, Jul.-Aug. 1971, pp. 133-135.

Stoll, M. E., "Simple Fast Recovery, Low-Noise Receiver Amplifier for Pulsed NMR Experiments", Rev. Sci. Instrum. 52(3), Mar. 1981, pp. 391-395.

Primary Examiner—Gene Wan
Attorney, Agent, or Firm—Geoffrey H. Krauss; James C. Davis, Jr.; Marvin Snyder

[57] ABSTRACT

A low-noise radio-frequency preamplifier, especially suited for use in the reception channel of a nuclear magnetic resonance spectrometer and the like, utilizes a low-noise input stage having a plurality of bipolar junction transistors effectively connected in radio-frequency parallel, but with each of the plurality of parallel bipolar transistors isolated from one another for direct current flow through at least one electrode thereof.

16 Claims, 11 Drawing Figures

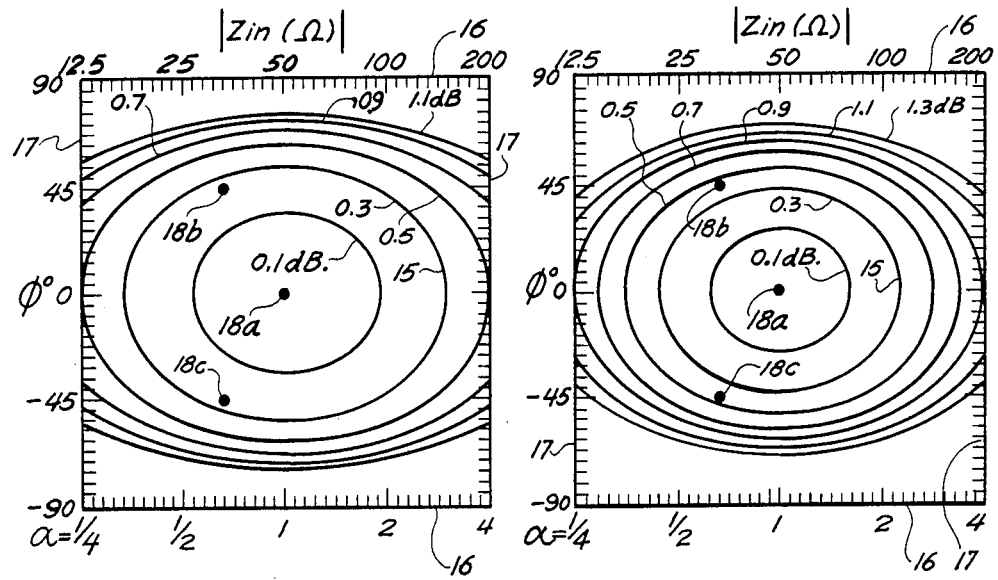
(NF = 0.5 dB.)
Fig. 1a
(NF = 1.0 dB.)
Fig. 1b
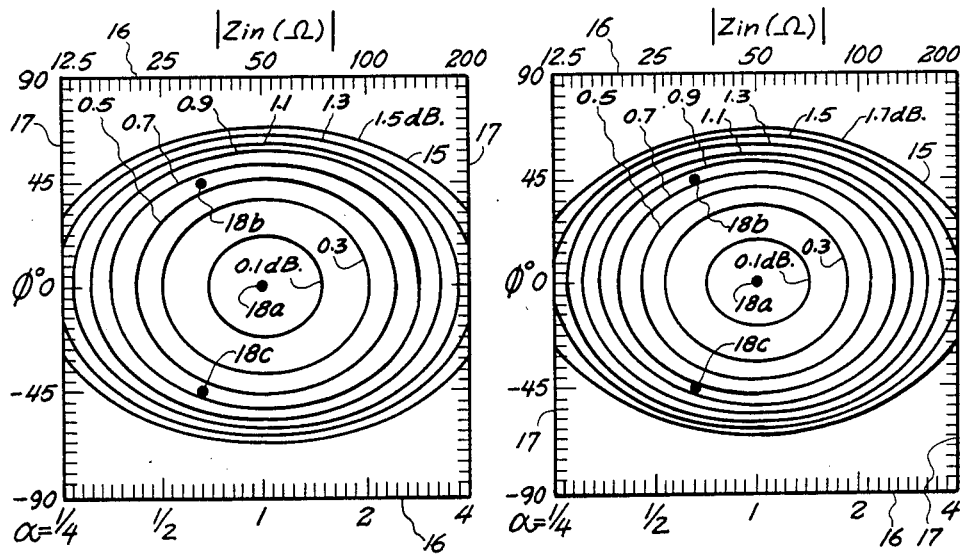
(NF = 1.5 dB.)
Fig. 1c
(NF = 2.0 dB.)
Fig. 1d

LOW-NOISE RF PREAMPLIFIER (ESPECIALLY FOR NUCLEAR MAGNETIC RESONANCE SYSTEM)

BACKGROUND OF THE INVENTION

The present invention relates to low-noise preamplifiers and, more particularly, to a novel low-noise preamplifier circuit utilizing a plurality of bipolar transistors in radio-frequency (RF) parallel connection, particularly for use in a nuclear magnetic resonance (NMR) imaging/spectroscopy system, and the like, with a response signal reception antenna having an impedance not matched to a system standard characteristic impedance.

It is well known that the amplitude of received RF signals, particularly in nuclear magnetic resonance (NMR) imaging and spectroscopy experiments, can be relatively small. If high-gain amplifiers are provided to increase the signal amplitude, the signal-to-noise ratio becomes a prime consideration; the high-gain amplifier must contribute relatively little noise power. Thus, a low-noise, high-gain preamplifier must add as small an amount of extra noise power as possible; this is equivalent to requiring that the noise factor, noise figure or effective temperature of the preamplifier to be as low, i.e. as close to 1, 0 dB. or 0° K., respectively, as possible. As a preamplifier has not yet been build which does not contribute some additional noise power at its output, a non-zero noise contribution will be provided by the preamplifier in any receiving system. While it is desirable to provide a noise level below some maximum level (and to provide such a low-noise preamplifier at the lowest possible cost) cost and noise level must be balanced against an associated minimum preamplifier gain (necessary for overcoming the noise contributions of subsequent receive subsystem stages) which must be present over a certain minimum useful frequency bandwidth. In an NMR system, as an illustrative example, the frequency characteristics of the preamplifier are thus dependent upon the particular experiment, or set of experiments, to be carried out upon a sample. In an NMR system for displaying an image having spatial brightness related to the spatial characteristics of one particular nuclear specie, e.g. a proton ($^1$H) image, with the sample immersed in a main static magnetic field $B_0$ of essentially constant magnitude, the NMR excitation/response, or Larmor, frequency F is given in accordance with the well-known relationship: $F = \gamma B_0/2\pi$, where $\gamma$ is the gyromagnetic constant for that particular nuclear specie. Thus, for a single-specie (proton) imaging NMR system (with $\gamma = 42.58$ MHz./Tesla, for $^1$H) operating at a static field intensity $B_0$ in the range from about 0.1 Tesla (T) to about 4 T, a single center operating frequency F of between about 4.26 MHz. and about 170.32 MHz., with an effective bandwidth of no more than 1%, would be necessary. It is relatively easy to provide such a system with a relatively low-cost RF preamplifier having a low "spot", or narrow-bandwidth, noise figure. However, in an NMR system for performing both imaging and spectroscopy experiments upon a sample, such as a human patient for medical diagnostic purposes, a single nuclear specie is rarely involved, even if practical considerations do require that the main static magnetic field have essentially a single value. For example, in analyzing living tissue, not only is the proton density ($\gamma = 42.58$ MHz./T) of interest, but spectroscopic chemical-shift information may be acquired for such nuclear species as: carbon ($^{13}$C), having a gyromagnetic ratio $\gamma$ of about 10.71 MHz./T; fluorine ($^{19}$F), having a gyromagnetic ratio $\gamma$ of about 40.05 MHz./T; sodium ($^{23}$Na), having a gyromagnetic ratio $\gamma$ of about 11.26 MHz./T; and phosphorous ($^{31}$P), having a gyromagnetic ratio $\gamma$ of about 17.23 MHz./T. It will be seen that the effective receiving system bandwidth and, therefore, the preamplifier bandwidth, is now substantially established by the ratio of the highest to lowest gyromagnetic ratios for the involved nuclear species. Specifically, for the chemical-shift spectrographic imaging NMR system capable of operating with hydrogen, carbon, fluorine, sodium and phosphorous nuclei, a frequency span of almost two octaves (i.e. almost 4×, or 42.58/10.71 = 3.976) is required. In such a system (as is described and claimed in co-pending U.S. patent application Ser. No. 743,125, filed June 10, 1985, assigned to the assignee of the present application and incorporated by reference in its entirety herein), a single main static magnetic field having an amplitude between about 0.7 T and about 4 T is utilized for production of proton and chemical-shift spectrographic images, corresponding to a frequency band from about 7.5 MHz. to about 29.8 MHz. for the lowest static field $B_0$ magnitude (0.7 T) system and a frequency range from about 42.8 MHz. to about 170.3 MHz. for the system using the highest static field $B_0$ magnitude (4 T). For the exemplary system of the aforementioned co-pending application, in which a main static magnetic field of about 1.5 T is used, the response signal preamplifier must have a low-noise, high-gain bandwidth between at least 16 MHz. and at least 64 MHz., which frequency range will be utilized, by way of example only, in the present application.

Typically, a low-noise RF preamplifier is designed to have its input attached to a transformed signal source impedance having a predetermined optimum value. This preamplifier optimum source impedance is normally established by an input network matching the preamplifier device to a standard RF characteristic impedance $Z_0$, e.g. $Z_0 = 50$ ohms. In an NMR system, the source impedance seen by the low-noise preamplifier is provided by the response-signal antenna; the antenna impedance will itself depend upon the magnitude and phase of any external loading. It has been found that, due to the differing sizes of the sample-to-be-investigated introduced into the effective volume of the antenna, the antenna impedance can vary over a wide range; this is especially true in systems extracting medical diagnostic data from human patients, where the size, weight and other characteristics of the patient can vary over relatively broad ranges. The result of any deviation from the optimum value of response-signal antenna impedance results in a noise level degradation, which degradation increases with increasing noise factor (F)/noise figure (NF)/noise temperature ($T_e$) of the reception system. A theoretical and experimental analysis will show that the noise level degradation is reduced, for the same relative ratio of actual source impedance to optimum source impedance, as the noise figure of the receiver is itself reduced. Thus, providing a high-gain, broad bandwidth reception preamplifier having a very low noise level permits the reception antenna source impedance to vary over a conjugately broader range, without requiring additional impedance-matching networks between the antenna terminals and the preamplifier input. The elimination of impedance-matching networks is especially useful in a clinical medical environment, as it saves set-up time while the patient is within the bore of the NMR system magnet and thus reduces the time which both the patient and the imaging staff must spend in obtaining the desired information. In addition, the elimination of an impedance-matching network also removes the network attenuation from appearing between the reception antenna and the preamplifier input; absence of this additional signal loss mechanism itself increases the NMR signal-to-noise ratio.

BRIEF SUMMARY OF THE INVENTION

In accordance with the invention, a low-noise RF preamplifier, particularly suited for use in an NMR diagnostic system, utilizes a low-noise input stage having a plurality of bipolar transistors effectively connected in RF parallel, and with each of the plurality of paralleled bipolar transistors isolated from one another for direct current flow to at least one electrode thereof.

In presently preferred embodiments, at least one additional gain stage is serially connected to the low-noise input stage; switch selection of total preamplifier gain may be utilized as desired. Provision is made for separately setting the collector-emitter controlled-conduction circuit current in each of the parallel bipolar transistors.

Accordingly, it is an object of the present invention to provide a low-noise preamplifier having a plurality of bipolar transistors effectively connected in parallel for RF signals.

This and other objects of the present will become apparent upon reading of the following detailed description, when considered in conjunction with the drawings.

BRIEF DESCRIPTION OF THE DRAWINGS

FIGS. 1a–1d are graphs illustrating the additional noise figure deterioration provided by a source impedance having amplitude/phase characteristics different from the optimum source impedance, for several values of preamplifier noise figure, and useful in appreciating several benefits of the present invention;

DETAILED DESCRIPTION OF THE INVENTION

Figure 1:
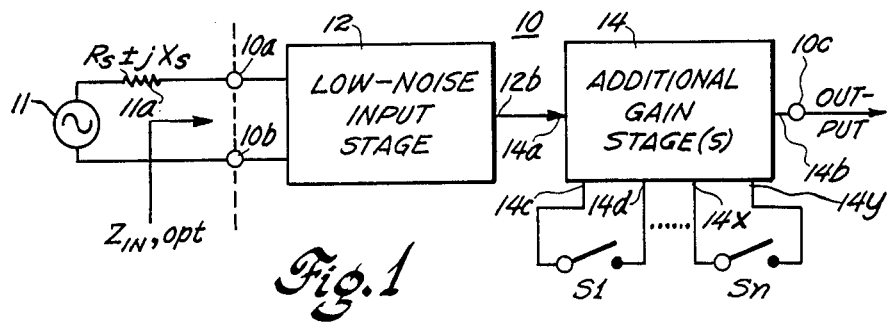
FIG. 1 is a schematic block diagram of a low-noise preamplifier and of the signal source connected thereto.

Referring initially to FIG. 1, a low-noise RF preamplifier 10 is utilized for amplification of the signal from an RF source 11, with the least contribution of noise power thereto. The source 11 signal appears in series with a source impedance 11a between the input terminals 10a and 10b of the preamplifier. The lowest additional noise power added to the noise provided by source resistance 11a occurs when the preamplifier 10 is adjusted to provide a minimum noise figure for an optimum input impedance $Z_{IN,opt}$ having a real part equal to the actual source resistance $R_S$ and an imaginary part equal to the conjugate of the actual source reactance $X_S$. The signal from source 11, along with the associated thermal noise from the resistive portion of source impedance 11a, is applied to the input 12a of a low-noise input stage 12, having an output 12b at which the amplified source signal appears with a signal-to-noise ratio having a minimized increment less than the signal-to-noise ratio of a signal at input 10a. At least one additional gain stage 14 receives the input stage output signal at its input 14b and provides a preamplifier output signal at an output 14b, connected to the preamplifier output 10c. The gain of additional stage(s) 14 may be adjusted by operation of at least one switching means S1–Sn, each connected to a pair of gain-setting terminals 14c and 14d, . . . , 14x and 14y.

The noise factor (F) of the overall signal reception apparatus is, as well known to the art, dependent upon the noise factor ($F_1$) of the input stage 12, the noise factor ($F_2$) of the additional gain stage(s) 14 and the noise factor ($F_3$) of the receiver apparatus (not shown) attached to preamplifier output 10c, as well as to the signal gain ($G_1$) associated with input stage 12 and the additional gain ($G_2$) associated with stage(s) 14, in accordance with the wellknown formula:

$$F = F_1 + ((F_2 - 1)/G_1) + ((F_3 - 1)/G_1 G_2). \quad (1)$$

Thus, minimum overall noise factor F occurs with each of the input and additional stages having minimum noise factor $F_1$ and $F_2$ and maximum gain $G_1$ and $G_2$. However, it is well known that noise factor and gain of a semiconductor amplifier device are both functions of several device parameters, of which the most important user-controllable parameter is device current. The question of the proper level at which to set the device parameters is typically resolved, for radio-frequency communication preamplifiers, by adjusting all parameters of the input stage for the lowest stage noise figure and by adjusting all parameters of the additional stage(s) for highest gain, commensurate with the achievement of satisfactory magnitudes of ancillary factors, such as third order intercept characteristics and the like. Preamplifier 10 can be adjusted in this manner, for applications requiring the resulting characteristics.

For use in an NMR system, we have found that in the use of a low-noise preamplifier 10, particularly one having an input stage in which a plurality of bipolar junction transistors are connected in parallel for RF signals, it is particularly advantageous if the preamplifier is adjusted for lowest possible noise figure.

Referring now to FIGS. 1a–1d, each figure illustrates a set of noise contours 15, plotted on graphs having the magnitude $|Z_{in}|$ of the input impedance plotted along horizontal axis 16 and having the input impedance phase angle $\phi$ plotted in degrees, positive and negative, along vertical axis 17, for each of four different values of preamplifier noise figure (as measured at the system characteristic impedance of $50 \pm j0°$ ohms). Briefly, it can be shown that the amplifier noise factor $F_1$ is given by $$F_1 = 1 + (v_n^2 + i_n^2(R_s^2 + X_s^2))/(4R_S kT) \quad (2)$$

where $R_S$ is the source resistance and $X_s$ is the source reactance, T is the temperature (degrees K), k is Boltzmann's constant, $i_n$ is the equivalent amplifier input noise current and $v_n$ is the equivalent amplifier input noise voltage. When the preamplifier is turned to the system characteristic impedance, $Z_0$, which impedance is typically set equally to a purely resistive value, e.g. $50\pm j0$ ohms, the source reactance $X_s$ is set equal to zero and the noise figure can be shown to be a minimum for that source resistance value $R_s$ equal to the optimum resistance value $R_{s,opt}$ (which is itself equal to the ratio of the input noise voltage $v_n$ to the input noise current $i_n$). Thus, the minimum noise factor is $$F_{1,min} = 1 + ((i_n v_n)/2kT). \tag{3}$$

If the actual source impedance $Z_s$ is equal to $\alpha\, R_{opt}$, where $\alpha$ is a constant (which is equal to 1 when the actual impedance $Z_s$ is equal to the system impedance $Z_0$), then the minimum noise factor (equation 3) can be rewritten as:

$$F_1 = 1 + (i_n v_n/2kT)\,((1+\alpha^2)/(2\alpha \cos \phi)) \tag{4}$$

where $\phi$ is the phase angle of the source impedance, as given by $\phi = \arctan(X_s/R_s)$. A comparison of equations (4) and (3) indicates that the minimum noise figure of equation (4) has the "added noise" term $(i_n v_n/2kT)$ multiplied by a "mismatched factor" term $((1+\alpha^2)/(2\alpha \cos \phi))$. Therefore, as the preamplifier minimum noise factor $F_{1,min}$ increases, the increased additional noise is itself multiplied by the increased mismatch factor (for values of $\alpha$ not equal to 1) and the apparent noise factor $F_1$ suffers an additional noise degradation for a given impedance mismatch factor. Thus, for a preamplifier having been tuned for a minimum noise figure (FIGS. 1a–1d) for the system characteristic impedance ($\alpha = 1$, $\phi = 0°$) at point 18a, the noise contours 15 indicate the degradation in effective noise figure for deviations from the system-optimum source impedance. For example, if the essentially resistive source impedance is paralleled by a reactance of the same numerical value, the equivalent series impedance $Z_s$ is given by: $Z_s = |R_0/\sqrt{2}| \angle \pm 45°$, e.g. paralleling the 50 ohm resistive system impedance with a 50 ohm reactance $X_s$. Depending upon whether the reactance $X_s$ is inductive or capacitive, the impedance will move to one of points 18b or 18c. For a preamplifier with a minimum noise figure of 0.5 dB. at the system characteristic impedance, e.g. at $50\pm j0$ ohms, an additional 0.25 dB. of noise figure is added to the preamplifier effective noise figure when the preamplifier "sees" a source impedance of $35 \angle \pm 45°$ ohms. Thus, the overall noise figure has moved (worsened) from 0.5 dB. to $(0.5+0.25)$ dB. $= 0.75$ dB. This is, in effect, a multiplication of the noise factor of the preamplifier by 1.189. As can be seen for other preamplifiers having minimum noise figures of 1.0, 1.5 and 2.0 dB., in respective FIGS. 1b, 1c and 1d, a similar change in input impedance (to the same points 18b or 18c) adds additional noise, as is illustrated by the associated noise contours 15, which is about 0.45 dB. for a 1.0 dB. preamplifier (at $50\pm j0$ ohms), about 0.6 dB. for a preamplifier having a minimum noise figure of 1.5 dB., and about 0.75 dB. for a preamplifier having a minimum noise figure of 2.0 dB. These additional noise contributions result in the four preamplifiers having a total noise figure, and associated noise ratio, as given in the table below:

| MINIMUM NOISE FIGURE | ADDITIONAL NOISE FIGURE | TOTAL NOISE FIGURE | "INCREASE" RATIO |
| --- | --- | --- | --- |
| 0.5 dB. | 0.25 dB. | 0.75 dB. | 1.189:1 |
| 1.0 dB. | 0.45 dB. | 1.45 dB. | 1.396:1 |
| 1.5 dB. | 0.60 dB. | 2.10 dB. | 1.622:1 |
| 2.0 dB. | 0.75 dB. | 2.75 dB. | 1.884:1 |

Thus, the lower the minimum noise figure of the matched preamplifier, the less additional noise is introduced if the source impedance is detuned from the system impedance $Z_0$. As previously described hereinabove, NMR antennae are typically subjected to detuning effects which vary with the particular sample-to-be-investigated, and which detuning effects cannot easily be predetermined. Accordingly, the least additional introduced noise, and therefore, the least lost sensitivity, will occur if the lowest added-noise preamplifier is utilized in the NMR system so that wider ranges of reception antenna impedance mismatch can be tolerated before a predetermined degree of desensitation occurs.

Figure 2:
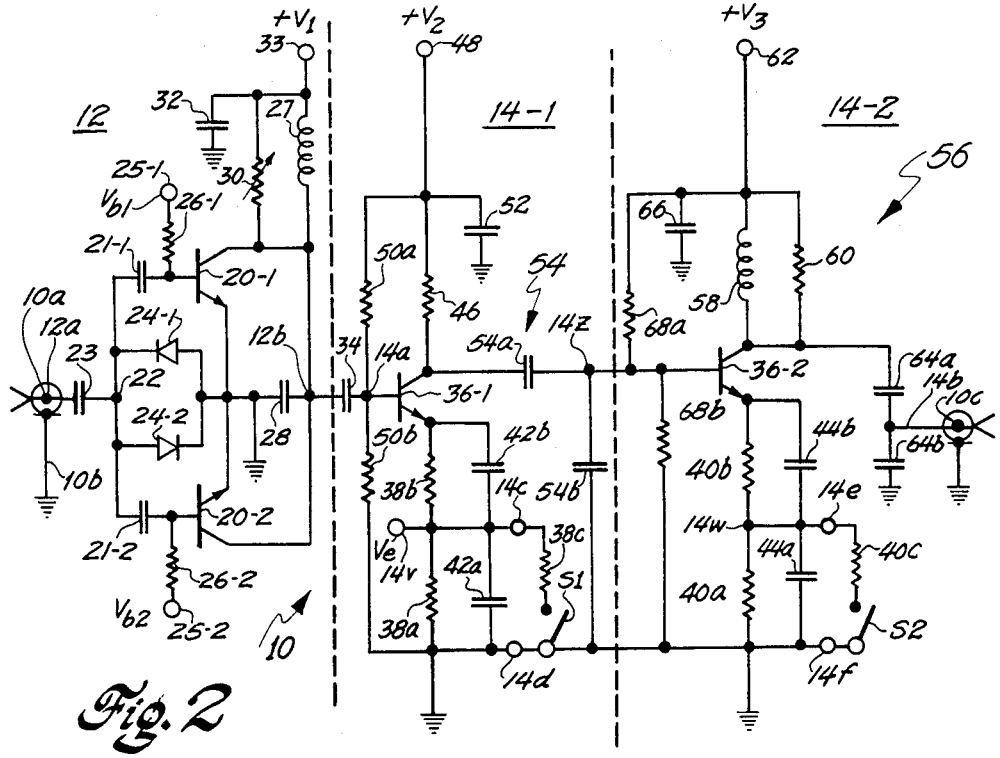
FIG. 2 is a schematic diagram of one presently preferred embodiment of the preamplifier of the present invention.

Referring now to FIG. 2, in accordance with one aspect of the present invention, the low-noise input stage 12 comprises a plurality N, e.g. N=2, of bipolar junction transistors 20 effectively connected in parallel for RF signals, but effectively separated for DC current, such that at least one of the bias conditions of each of the transistors 20-1 or 20-2 can be separately established. Thus, the emitter electrodes were both of the illustratively NPN transistors 20-1 and 20-2 are connected to circuit common potential. The base electrodes of each of the transistors are connected through an associated DC-blocking capacitor 21-1 or 21-2, to a node 22. A coupling capacitor 23 connects node 22 to the low-noise stage input 12a, at preamplifier input connection 10a. A pair of anti-parallel-connected diodes 24-1 and 24-2 are connected between node 22 and circuit common potential 10b, to provide protection against damage by excessively large signals at the preamplifier input 10a. Each of the transistor base electrodes is connected to one of bias potential terminals 25-1 or 25-2 through an associated bias resistance 26-1 or 26-2, respectively. The bias voltage $V_b$ introduced at each of terminals 25 must place the associated transistor 20 in a class A linear operating mode, for lowest noise performance. The collector electrodes of transistors 20-1 and 20-2 are connected in parallel to one terminal of a load inductance 27, effectively connected in RF parallel with a tuning capacitance 28 and a damping resistance 30. The remaining terminals of inductance 27 and resistance 30 are bypassed for RF potential by capacitance 32, and receive a first stage operating potential $+V_1$ at terminal 33. The remaining terminal of capacitance 28 is coupled to circuit common potential. The amplified signal at the paralleled collector electrodes and output node 12b is coupled via a capacitive element 34 to the input 14a of the additional gain stages 14.

The at least one additional gain stages 14 here comprises a pair of stages 14-1 or 14-2, each utilizing an amplifying device 36-1 or 36-2. Each device 36 may be either polarity of bipolar or field-effect transistor; input stage 12 transistors 20-1 and 20-2 are only bipolar junction devices and are typically fabricated as silicon transistors of the NPN type. Illustratively, devices 20 may be type MA42197 transistors, available from Microwave Associates, while devices 36 may be type MRF904 transistors, available from Motorola Semiconductor Corp. Each additional gain stage transistor 36-1 or 36-2 is DC biased by a pair of series-connected resistances 38a and 38b or 40a and 40b, connected between the device emitter electrode and circuit common potential, and individually bypassed by an associated one of a pair of capacitive elements 42a and 42b or 44a and 44b. Each emitter resistance network includes a third emitter resistance 38c or 40c which is switchably connected between the common node 14v or 14w, respectively, to circuit common potential through an associated one of switches S1 or S2, for gain-changing purposes. The first additional stage 14-1 transistor 36-1 has its collector electrode connected to one terminal of a collector load resistance 46, having the other terminal thereof connected to a stage operating potential $+V_2$ terminal 48. A first bias resistance 50a is connected between terminal 48 and the base electrode of device 36-1, at input terminal 14a. The base electrode of the device is connected through a second bias resistance 50b to circuit common potential. Terminal 48 is RF bypassed to common potential by a bypass capacitance 52. The amplified signal at the collector electrode of first additional stage device 36-1 is coupled to an interstage node 14z by DC-blocking/impedance-matching network 54, comprising a series capacitance element 54a and a shunt capacitance element 54b. The additional gain section 14 output stage 14-2 includes a collector network 56 including an inductive element 58, shunted by a resistive element 60, connected between the collector electrode of device 36-2 and a terminal 62 at which the output stage operating potential $+V_3$ is provided. Network 56 also includes output impedance-matching/DC-blocking capacitive elements 64a and 64b, having the midpoint therebetween forming the additional gain stage section output 14b, connected to the preamplifier output 10c. The output section operating potential terminal 62, which is RF bypassed to circuit common potential by bypass capacitance element 66, is also connected through an output stage first biasing resistance 68a to the base electrode of device 36-2, which base electrode is connected through a second biasing resistance 68b to circuit common potential.

Figures 2A, 2B:
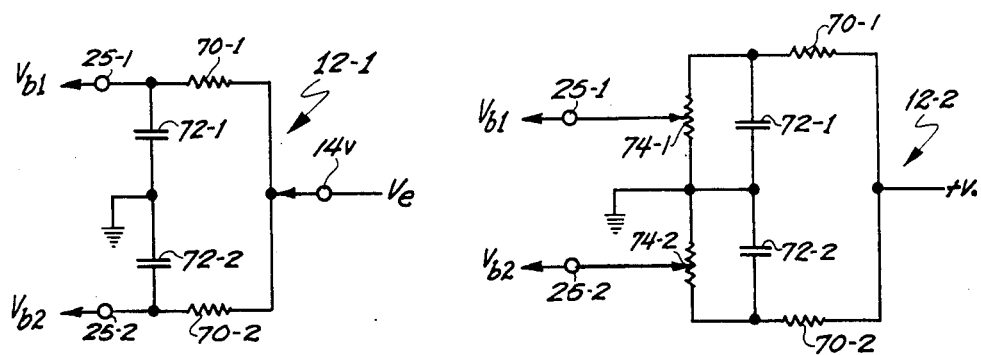
FIGS. 2a and 2b are first and second embodiments of preamplifier input stage biasing networks useable with the preamplifier of FIG. 2.

The input stage bipolar transistors 20-1 and 20-2 have their emitter and collector electrodes connected in parallel, both for RF and DC signals. The base electrodes are connected in RF parallel, through coupling capacitances 21-1 and 21-2, which capacitive elements form a direct current isolation means, so that the collector current of each device can be separately established by the associated base electrode biasing resistances 25-1 or 25-2 and the bias voltage $V_{b1}$ or $V_{b2}$ at associated terminal 25-1 or 26-1. This pair of bias voltages can be provided by a fixed biasing network 12-1 (FIG. 2a) having a first terminal of each of first and second additional series biasing resistances 70-1 and 70-2 receiving a single potential, e.g. the potential from the first additional stage 14-1 emitter circuit voltage $V_e$ node 14v. The remaining end of resistance 70-1 is connected to the $V_{b1}$ bias terminal 25-1, while the remaining end of bias resistance 70-2 is connected to the second bias potential $V_{b2}$ terminal 25-2. Each of these terminals may be bypassed by additional bypass capacitances 72-1 and 72-2, of magnitude as required for providing the proper low-pass-filtering characteristics to the bias network. The series resistors 70 of bias network 12-1, in conjunction with the series resistors 26, can be selected to cause the collector current of each of input stage transistors 20-1 and 20-2 to have that "bogie" value of collector current at which device added-noise power is minimal. However, it is well known that individual devices, even of the same type and lot, can show minimum noise performance at a value of collector current often differing from this bogie value by as much as a factor of 4; accordingly, a network 12-2 (FIG. 2b) having individual bias adjustment potentiometer 74-1 and 74-2, is much preferred.

Each of the plurality N (where N is an integer greater than 1) of the bipolar junction transitors, connected in RF parallel for the preamplifier input stage, is selected to exhibit a sufficiently low noise factor at an optimum source impedance on the order of $NxZ_0$. Thus, by individually adjusting the flow of current in the device controlled-conduction circuit, i.e. the collector-emitter circuit of each bipolar junction transistor, the noise figure of each device is set for minimum, when coupled to a source having the $NxZ_0$ impedance. Thereafter, the N low-noise devices are combined in a DC-isolated but RF-parallel manner so that the total input stage optimum source impedance is equal to (a) the source impedance required to be seen by each individual stage ($Z=NxZ_0$), divided by (b) the number of stages N. Therefore, combining the N parallel stages yields a total preamplifier input impedance equal to the system characteristic impedance $Z_0$. Not only does this tend to assure a minimized noise figure, but also to provide some degree of redundancy to the preamplifier low-noise input stage. The low noise figure of this stage may be due to the reduction of the effective bulk resistance $r_b$ of the base electrode region in each of the bipolar junction transistors by the RF parallel connection thereof; the base bulk resistance $r_b$ is recognized as a significant contributor of internal noise in a bipolar junction transistor. Thus, the decreased effective base bulk resistance not only decreases the effective noise figure, but also combines with the typical low magnitude of impedances encountered at the involved RF frequencies with bipolar junction transistors, to yield a considerably larger bandwidth, at relatively low noise figures, than would be provided in the relatively higher input and load impedances encountered when using junction or insulated-gate field-effect transistors. The use of multiple transistors optimally noise matched to the system characteristic impedance over a broad frequency bandwidth, typically over a plurality of octaves, removes additional effects, such as: additional loss and noise injection from impedance matching networks between the source (antenna) and the preamplifier input; noise figure degradation due to emitter biasing-/bypass circuitry in the input stage; and the like. It should be understood that, dependent upon the noise factor and gain of the low-noise input stage 12, the first additional gain stage 14-1 may also require the use of a plurality of bipolar junction transistors connected in RF parallel, but separately connected for DC (similar to the input stage), to provide the additional stage noise factor $F_2$ at a sufficiently low level.

Figure 3A:
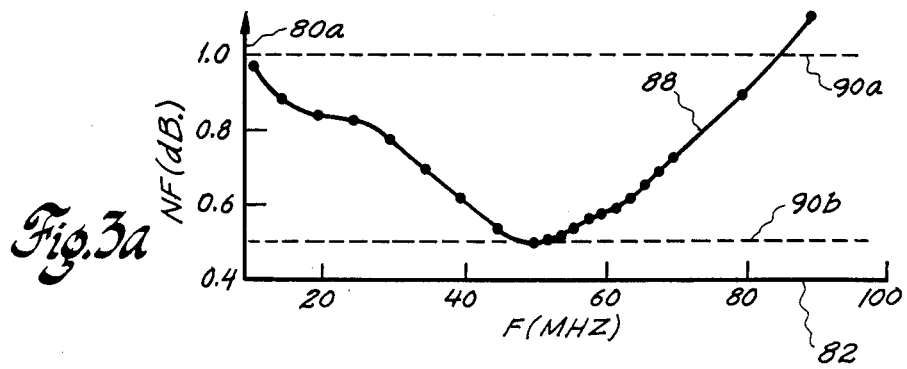
FIGS. 3a–3c are graphs illustrating the relationship of noise figure to frequency, source resistance and source susceptance in the preamplifier according to the invention.
Figure 3B:
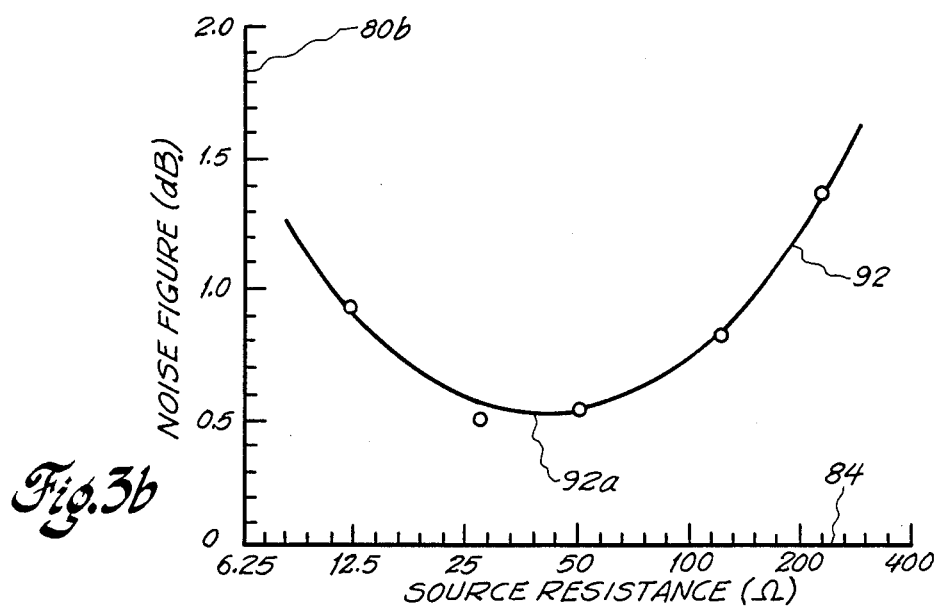
Figure 3C:
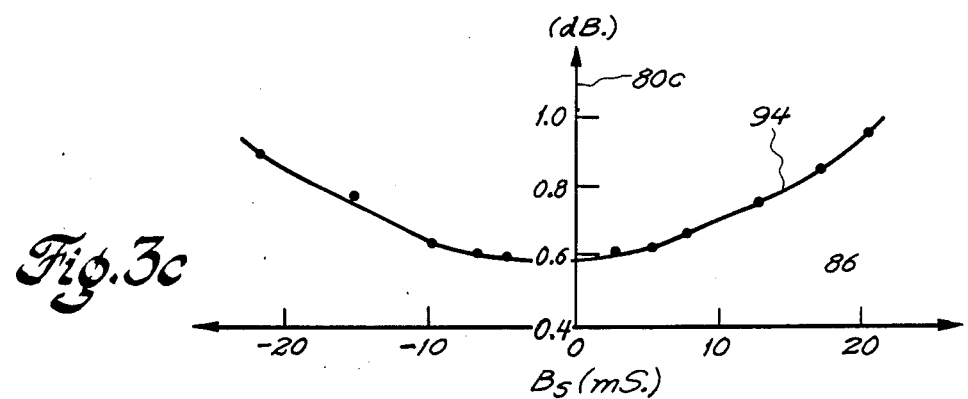

The resulting performance of a preamplifier, according to the illustrative embodiment of FIG. 2, is illustrated in FIGS. 3a–3c. The noise figure of the preamplifier, in decibels, is plotted along one of ordinates 80a–80c (in FIGS. 3a–3c) while the frequency, in MHz., is plotted along abscissa 82 (FIG. 3a), source resistance ($R_s$, in ohms) is plotted along logarithmically-scaled abscissa 84, and source susceptance ($B_s$, in milliSiemens)

as plotted along abscissa 86. The noise figure curve 88 (FIG. 3a) illustrates that a noise figure less than 1.0 dB. (indicated by broken line 90a), is provided over at least a frequency range from about 10 MHz. to at least about 80 MHz. The minimum noise figure of about 0.5 dB. (the level indicated by broken line 90b), is approached in the vicinity of 50 MHz.; in the vicinity of the proton ($^1$H) Larmor frequencies of about 64 MHz., for a 1.5 T static field, noise figures on the order 0.6 dB. are obtained, for a 50 ohm characteristic antenna impedance, without the use of matching networks. The earlier theoretical degradation graphs (of FIGS. 1a–1d) are experimentally validated by the resulting degradations of noise figure with changes of source resistance or source susceptance, at an operating frequency of about 62 MHz., as shown in FIGS. 3b and 3c. It will be seen that the curve 92 of noise figure vs. source resistance $R_s$ (in FIG. 3b) has a minimum noise figure point 92a at an optimum source resistance, e.g. about 40 ohm, which is less than the resistive portion of the system characteristic impedance, e.g. 50 ohms. The minimum noise figure of 0.52 dB. is thus achieved at an actual source resistance below the system characteristic resistance, but with a low noise figure, e.g. 0.6 dB. for source resistances between about 25 ohms and about 70 ohms. Given that the reception antenna will have the characteristic (50 ohm) resistance at the center Larmor resonance frequency and in an unloaded condition, then the introduction of a sample provides a shunt impedance which lowers the resistive portion of the antenna terminal impedance, as seen by the preamplifier. Therefore, having a optimum resistance, at which the minimum noise figure occurs, less than the system characteristic resistance provides a larger set of loaded antenna conditions at which relatively low preamplifier noise figures are actually attained. Similarly, the symmetrical nature of the noise figure vs. susceptance curve 94 (FIG. 3c), for a source resistance of 50 ohms, provides relatively little noise figure degradation for moderate excursions of susceptance, of either polarity, as might be encountered with arbitrary experimental samples.

It will therefore be seen that a low-noise RF preamplifier, especially suited for nuclear magnetic resonance sample investigation systems, having a low-noise input stage in which a plurality of bipolar junction transistors are coupled in RF parallel connection, but are maintained in individual DC connection to allow the operational characteristics of each transistor to be separately established, can provide characteristics particularly useful in certain practices of the art.

While one presently preferred embodiment of such a low-noise preamplifier has been described in some detail herein, many variations and modifications will now occur to those skilled in the art. It is our intent, therefore, to be limited only by the scope of the impending claims and not by the specific details or instrumentalities presented herein by way of description of that preferred embodiment.

What we claim is:

1. A radio-frequency (RF) preamplifier comprising: a linear low-noise input stage having a plurality N of bipolar junction transistors having like electrodes effectively connected in RF parallel, and with each of the base electrodes of said plurality of parallel bipolar junction transistors being isolated from one another for direct current flow.

2. The preamplifier of claim 1, further comprising at least one additional gain stage serially connected after the low-noise input stage.

3. The preamplifier of claim 2, further comprising means for switch selecting the total preamplifier gain.

4. The preamplifier of claim 3, further comprising means for independently setting the collector current in each of the paralleled transistors.

5. The preamplifier of claim 2, further comprising means for independently setting the collector current in each of the paralleled transistors.

6. The preamplifier of claim 1, further comprising means for independently setting the collector current in each of the parallel transistors.

7. The preamplifier of claim 1, wherein the input stage transistors are each biased to have an optimum input impedance of about $NxZ_0$, where $Z_0$ is a preselected characteristic impedance.

8. The preamplifier of claim 7, wherein N=2, $Z_0$ is about 50 ohms and the optimum source impedance of the preamplifier is between about 25 ohms and about 70 ohms at a predetermined frequency.

9. In combination in a nuclear magnetic resonance (NMR) sample investigation system: an antenna for receiving an NMR response signal; and a radio-frequency (RF) preamplifier comprising a linear low-noise input stage having a plurality N of bipolar junction transistors having like electrodes effectively connected in RF parallel and directly connected to said antenna without any additional impedance-matching network therebetween and with each of the base electrodes of said plurality of parallel bipolar junction transistors being isolated from one another for direct current flow.

10. The combination of claim 9, wherein said preamplifier further comprises at least one additional gain stage serially connected after the low-noise input stage.

11. The combination of claim 10, further comprising means for switch selecting the total preamplifier gain.

12. The combination of claim 11, further comprising means for independently setting the collector current in each of the paralleled transistors.

13. The combination of claim 10, further comprising means for independently setting the collector current in each of the paralleled transistors.

14. The combination of claim 9, further comprising means for independently setting the collector current in each of the paralleled transistors.

15. The combination of claim 9, wherein the input stage transistors are each biased to have an optimum input impedance of about $NxZ_0$, where $Z_0$ is a preselected characteristic impedance.

16. The combination of claim 15, wherein N=2, $Z_0$ is about 50 ohms and the optimum source impedance of the preamplifier is between about 25 ohms and about 70 ohms at a predetermined frequency.

* * * * *